United States Patent [19]

Ju

[11] Patent Number: 5,846,857
[45] Date of Patent: Dec. 8, 1998

[54] CMOS PROCESSING EMPLOYING REMOVABLE SIDEWALL SPACERS FOR INDEPENDENTLY OPTIMIZED N- AND P-CHANNEL TRANSISTOR PERFORMANCE

[75] Inventor: Dong-Hyuk Ju, Cupertino, Calif.

[73] Assignee: Advanced Micro Devices, Inc., Sunnyvale, Calif.

[21] Appl. No.: 924,637

[22] Filed: Sep. 5, 1997

[51] Int. Cl.$^6$ ............................................. H01L 21/8238
[52] U.S. Cl. ..................... 438/199; 438/230; 438/231; 438/232; 438/303; 438/305; 438/307; 438/308; 257/336; 257/371
[58] Field of Search ..................................... 438/199, 230, 438/231, 232, 303, 305, 307, 308, 168, 204, 216, 217, 218; 257/336, 371

[56] References Cited

U.S. PATENT DOCUMENTS

| | | | |
|---|---|---|---|
| 4,891,326 | 1/1990 | Koyanagi | 4378/228 |
| 4,968,639 | 11/1990 | Bergonzoni | 438/228 |
| 5,030,582 | 7/1991 | Miyajima et al. | 438/231 |
| 5,696,016 | 12/1997 | Chen et al. | 1/1 |

*Primary Examiner*—John Niebling
*Assistant Examiner*—Long Pham

[57] ABSTRACT

N- and P-channel transistor characteristics are independently optimized for CMOS semiconductor devices with design features of 0.25 microns and under. Removable second sidewall spacers are formed on the N-channel transistor gate electrode having first sidewall spacers thereon. Ion implantation is conducted to form N-type moderately/heavily doped implants followed by activation annealing. The second sidewall spacer is then removed from the P-channel transistor leaving first sidewall spacers thereon serving as an ion implantation mask for the P-type lightly doped implants. Subsequently, third sidewall spacers are formed on the P-channel gate electrode having first sidewall spacers thereon followed by ion implantation to form the P-type moderately or heavily doped implants, with subsequent activation annealing. Embodiments enable complete independent control of the channel lengths of the N- and P-channel transistors by varying the width of the first, second and third sidewall spacers.

19 Claims, 2 Drawing Sheets

CMOS PROCESSING EMPLOYING REMOVABLE SIDEWALL SPACERS FOR INDEPENDENTLY OPTIMIZED N- AND P-CHANNEL TRANSISTOR PERFORMANCE

TECHNICAL FIELD

The present invention relates to a method of manufacturing a CMOS semiconductor device with independently optimized transistor performance. The invention has particular applicability in manufacturing high density CMOS semiconductor devices with design features of 0.25 microns.

BACKGROUND ART

The escalating requirements for high densification and performance associated with ultra large scale integration semiconductor devices requires design features of 0.25 microns and under, such as 0.18 microns and under, increased transistor and circuit speeds, high reliability and increased manufacturing throughput for competitiveness. The reduction of design features to 0.25 microns and under challenges the limitations of conventional semiconductor manufacturing techniques.

In order to reduce the number of manufacturing steps, such as masking, thereby increasing manufacturing throughput, the N-channel and P-channel transistors of a CMOS semiconductor device are conventionally exposed to similar processing conditions, such as spacer formation on the sidewalls of gate electrodes and heat treatment. Typically, the entire semiconductor wafer is placed in a furnace and subjected to heat treatment when activation annealing for converting impurity implants into source/drain regions. The economic advantage attendant upon increased manufacturing throughput comes at a price, however, in that the performance characteristics of the N-channel transistor and P-channel transistor cannot be individually tailored or optimized. For example, the diffusion coefficients of P-type impurity atoms, such as boron, are typically greater than those of N-type impurity atoms. Accordingly, during heat treatment, it is difficult to form the P-channel transistor with a shallow lightly doped junction depth ($X_J$). In addition, it is generally desirable to form the P-channel transistor with a channel region having a channel length greater than that of the channel region of the N-channel transistor, particularly in semiconductor devices having sub-micron features, to avoid the short channel effect characteristic of P-channel transistors.

As design features shrink to less than about 0.25 microns, the disadvantages attendant upon uniform processing of N-channel and P-channel transistors of a CMOS semiconductor device are exacerbated. For example, for design features of about 0.25 microns, it is necessary to significantly reduce the $X_J$ to less than about 800 Å. This, in itself, is difficult to achieve, let alone in a P-channel transistor of a CMOS device employing conventional methodology comprising activation annealing to activate both the N-channel transistor and P-channel transistor implants to form source/drain regions.

Conventional methodology for manufacturing a CMOS device comprises separately ion implanting to form N-channel and P-channel lightly doped implants using the N-channel transistor gate electrode and P-channel transistor gate electrode as masks, respectively. Subsequently, dielectric sidewall spacers are formed on the side surfaces of both gate electrodes. The P-channel transistor is then typically masked and ion implantation is conducted to implant N-type impurities into the semiconductor substrate using the gate electrode and sidewall spacers thereon as a mask to form moderately or heavily doped implants. High temperature activation annealing is then conducted to activate the N-channel source/drain regions, typically at about 1050° C. for about 30 seconds, i.e., rapid thermal annealing (RTA). During activation annealing, the implanted N-type impurities diffuse into the proper lattice site and implantation damage is reduced, thereby reducing junction leakage. The N-type impurity implants are generally activated at higher temperatures than those employed to activate the P-channel implants, since the N-channel implants are typically more difficult to activate than the P-channel source/drain implants. However, at the time of high temperature activation annealing to form the N-channel source/drain regions, the lightly doped P-channel implants diffuse to a great extent as P-type impurities typically diffuse significantly faster than N-type impurities. Subsequently, the N-channel transistor region is masked and ion implantation of P-type impurities is conducted to form moderately or heavily doped implants. Activation annealing is then conducted, at a temperature of about 1,000° C., to activate the P-channel source/drain regions. In practicing such conventional methodology, the lightly doped P-channel implants are exposed to both the N-channel activation annealing and the P-channel activation annealing, thereby undesirably increasing the $X_J$ beyond the targeted maximum of about 800 Å.

In copending application Ser. No.08/924,640 a method is disclosed for CMOS processing employing separate spacers thereby enabling independent control of the N-channel and P-channel transistor performance. In the disclosed method, the effective length of the channel region in the P-channel transistor is determined by the width of the gate electrode and the width of the first sidewall spacers thereon. However, the width of the first sidewall spacer also determines the length of the lightly doped portion of the source/drain regions in the N-channel transistor and, hence, the optimum characteristics of the N-channel transistor and the P-channel transistor are not completely decoupled. Accordingly, there exists a need for semiconductor methodology enabling completely independent optimization of the performance of N-channel and P-channel transistors of a CMOS device, particularly independent optimization of the lengths of the channel regions of the N- and P-channel transistors.

DISCLOSURE OF THE INVENTION

An object of the present invention is a method of manufacturing a CMOS semiconductor device enabling independent control of the N-channel and P-channel transistor characteristics.

Another object of the present invention is a method of manufacturing a CMOS semiconductor device with design features of 0.25 microns and under, with independent control of the length of the channel region of the N- and P-channel transistors.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved, in part, by a method of manufacturing a semiconductor device comprising an N-channel transistor and P-channel transistor, which method comprises: A method of manufacturing a CMOS semiconductor device comprising an N-channel transistor and a P-channel transistor, which method comprises: forming a dielectric layer on a surface of a semiconductor substrate; forming a conductive layer on the dielectric layer; patterning the conductive layer to form a first gate electrode for the N-channel transistor and a second gate electrode for the P-channel transistor, each gate electrode having an upper surface and side surfaces; using the first gate electrode as a mask, implanting impurities to form N-type lightly doped implants in the semiconductor substrate; forming first sidewall spacers, comprising a first insulating material and having a first width, on the side surfaces of the first and second gate electrodes; forming second sidewall spacers, comprising a second insulating material and having a second width, on the first sidewall spacers on the first and second gate electrodes; using the first gate electrode and first and second sidewall spacers thereon as a mask, implanting impurities to form N-type moderately or heavily doped implants in the semiconductor substrate; activation annealing at a first temperature to form source/drain regions of the N-channel transistor comprising N-type lightly doped and moderately or heavily doped portions, the N-type lightly doped portions extending below the surface of the semiconductor substrate to a first depth and the N-type moderately or heavily doped portions extending to a second depth greater than the first depth; removing the second sidewall spacers from the second gate electrode leaving the first sidewall spacers thereon; using the second gate electrode and first sidewall spacers thereon as a mask, implanting impurities to form P-type lightly doped implants in the semiconductor substrate; forming third sidewall spacers, comprising a third insulating material and having a third width, on the first sidewall spacers on the second gate electrode; using the second gate electrode and first and third sidewall spacers thereon as a mask, implanting impurities to form P-type moderately or heavily doped implants in the semiconductor substrate; and activation annealing at a second temperature to form source/drain regions of the P-channel transistor comprising P-type lightly doped and moderately or heavily doped portions, the P-type lightly doped portions extending below the surface of the semiconductor substrate to a third depth and the P-type moderately or heavily doped portions extending to a fourth depth greater than the third depth.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BEST MODE FOR CARRYING OUT THE INVENTION

Figure 1:
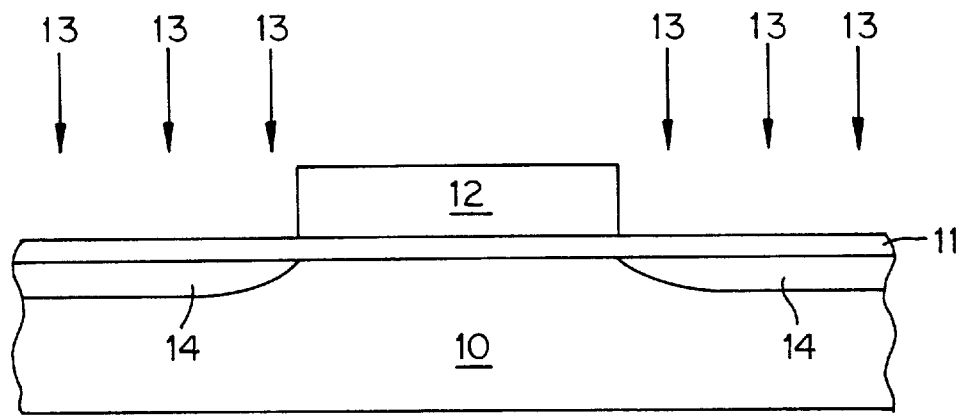
FIGS. 1 through 4 represent sequential stages in a method of manufacturing a CMOS semiconductor device according to an embodiment of the present invention.

The present invention provides methodology enabling independent control of transistor characteristics of N-channel and P-channel transistors of a CMOS semiconductor device while maintaining high production throughput. Advantageously, the present invention enables independent control of the channel length of the channel region of the P-channel transistor and N-channel transistor. The present invention achieves that objective while also enabling independent control of the lightly doped junction depth ($X_J$) of the P-channel transistor and of N-channel transistor, as in copending application Ser. No. 08/924,640 However, the present invention achieves even greater independent control, i.e., complete decoupling of the process variables impacting the channel length of the P-channel transistor vis-a-vis the channel length of the N-channel transistor.

In accordance with the present invention, the performance of the N-channel transistor and P-channel transistor is optimized independently, particularly the channel lengths of the respective transistors, by employing an intermediate removable spacer. In copending application Ser. No. 08/924,640 a first sidewall spacer is deposited on the gate electrodes of the N-channel and P-channel transistors. Accordingly, the effective length of the P-channel transistor is determined by the width of the gate electrode and the width of the first sidewall spacers thereon. However, the width of the first sidewall spacer also determines the length of the lightly doped portions of the source/drain regions in the N-channel transistor. Thus, the optimization of the N-channel transistor and the P-channel transistor are not completely decoupled. The present invention effects complete decoupling of the N-channel transistor and P-channel transistor, thereby enabling independent optimization of the channel length by employing an intermediate, removable sidewall spacer.

In accordance with an embodiment of the present invention, a gate dielectric layer, e.g., a silicon oxide, is formed on the surface of a semiconductor substrate, typically doped monocrystalline silicon. Gate electrodes, typically doped polycrystalline silicon, are formed in the N-channel and P-channel transistor regions. In accordance with this embodiment of the present invention, the P-channel transistor is masked and ion implantation is conducted to form N-type lightly doped implants in the semiconductor substrate, employing the gate electrode of the N-channel transistor as a mask. Implantation is conducted at a dosage and energy to optimize N-channel transistor performance, such as about $5 \times 10^{13}$ atoms cm$^{-2}$ to about $5 \times 10^{14}$ atoms cm$^{-2}$ and at an energy of about 10 KeV to about 30 KeV.

In accordance with the present invention, first sidewall spacers, comprising a first insulating material and having a first width, are formed on the side surfaces of the first and second gate electrodes. The first sidewall spacers, as are all sidewall spacers employed in the present invention, are formed in a conventional manner as by chemical vapor deposition (CVD) of an insulating material, such as a silicon oxide, a silicon nitride or a silicon oxynitride, followed by anisotropic etching. The first sidewall spacers are formed at a width designed for optimization of the length of the channel region in the P-channel transistor. Removable second sidewall spacers are then formed on the first sidewall spacers on the gate electrodes of the N- and P-channel transistors. The term "removable" is employed throughout this disclosure to denote that the sidewall spacers are capable of being substantially removed by any means, such as etching, without substantial removal of an underlying material, e.g., the first sidewall spacers. The removable second sidewall spacers comprise a second insulating material which preferably exhibits etching characteristics different from the first insulating material. Most preferably, the second insulating material is different from the first insulating material. The removable second sidewall spacers have a second width which is designed for optimization of the length of the lightly doped region in the N-channel transistor. The second sidewall spacer can also comprise a silicon oxide, a silicon nitride or a silicon oxynitride, preferably different from the first insulating material and having different etch characteristics.

Employing the gate electrode of the N-channel transistor and first and second sidewall spacers thereon as a mask, N-type impurities are ion implanted to form moderately or heavily doped implants in the semiconductor substrate. Ion implantation is conducted at a dosage and energy to optimize N-channel transistor performance, such as about $5 \times 10^{14}$ atoms cm$^{-2}$ to about $5 \times 10^{15}$ atoms cm$^{-2}$ and at an energy of about 40 KeV to about 60 KeV.

In forming the sidewall spacers, anisotropic etching can be conducted so that a portion of the underlying gate electrode layer remains to serve as an oxide screen for the moderate or heavy implants. Alternatively, a thermal oxide screen layer can be grown or, preferably, vapor deposited as disclosed in copending application Ser. No. 08/924,639 to minimize transient enhanced diffusion of implanted impurities.

Subsequent to formation of the moderately or heavily doped implants, activation annealing is conducted, such as RTA, at a temperature of about 1,0000°C. to about 1,1000°C., e.g., 1050°C., for about 10 seconds to about 45 seconds, e.g., 30 seconds, to activate the light and moderately or heavily doped implants to form the source/drain regions of the N-channel transistor. An advantageous feature of the present invention is that P-type impurities are not implanted into the semiconductor substrate in the P-channel transistor region until after activation annealing to form the N-channel source/drain regions. Accordingly, unlike conventional practices, lightly doped P-channel implants are not subjected to the more severe activation annealing required to form the N-channel transistor source/drain regions.

After activation annealing to form the N-channel source/drain regions, the second sidewall spacers are removed from the gate electrode of the P-channel transistor leaving the first sidewall spacers thereon. Removal of the second sidewall spacers is typically conducted by wet etching.

Employing the gate electrode of the P-channel transistor and first sidewall spacers thereon as a mask, and masking the N-channel transistor region, P-type impurities are ion implanted to form lightly doped P-channel implants in the semiconductor substrate. Third sidewall spacers, comprising a third insulating material and having a third width, are then deposited on the first sidewall spacers on the gate electrode of the P-channel transistor. Masking the N-channel transistor region and employing the gate electrode of the P-channel transistor and first and third sidewall spacers thereon as a mask, P-type impurities are ion implanted to form moderately or heavily doped implants in the semiconductor substrate. The third insulating material of the third sidewall spacer can also comprise a silicon oxide, a silicon nitride or a silicon oxynitride, and can be similar to the first insulating material. Advantageously, the width of the third sidewall spacer is independently selected, subsequent to formation of the source/drain regions in the N-channel transistor, for optimization of the length of the lightly doped region in the P-channel of transistor.

P-channel impurities are ion implanted to form lightly and moderately or heavily doped implants at a dosage and energy for optimized P-channel transistor performance. For example, in forming the P-type impurity lightly doped implants, ion implantation is conducted at a dosage of about $5 \times 10^{13}$ atoms cm$^{-2}$ to about $5 \times 10^{14}$ atoms cm$^{-2}$ and at an energy of about 5 KeV to about 10 KeV, while the P-type impurities are ion implanted into the semiconductor substrate to form the moderately or heavily doped implants typically employing a dosage of about $5 \times 10^{14}$ atoms cm$^{-2}$ to about $5 \times 10^{15}$ atoms cm$^{-2}$ and at an energy of about 20 KeV to about 40 KeV.

After forming the P-type moderately or heavily doped implants, activation annealing is conducted at a second temperature to form the source/drain regions of the P-channel transistor comprising P-type lightly doped and moderately or heavily doped portions. The P-type lightly doped portions extend below the surface of the semiconductor substrate to a third depth less than the fourth depth of the P-type moderately or heavily doped portions. The depth of the P-type lightly doped portions, i.e., junction depth ($X_J$), is typically about 600 Å to about 800 Å. Activation annealing to form the P-channel transistor source/drain regions is typically the temperature of about 9000°C. to about 1,000°C., e.g., about 1000°C. for about 10 seconds to about 45 seconds, e.g., about 30 seconds.

In accordance with the present invention, lightly doped P-channel implants are exposed to a single activation annealing step, thereby controlling the $X_J$ vis-à-vis conventional practices wherein the P-channel transistor lightly doped implants are subjected to the high temperature activation annealing to form the N-channel transistor source/drain regions as well as activation annealing to form the P-channel transistor source/drain regions. Thus, as in copending application Ser. No. 08/924,640 the $X_J$ for the N-channel transistor and the $X_J$ for the P-channel transistor can be independently tailored or optimized. However, in accordance with the present invention, the complete decoupling of the P-channel transistor and N-channel transistor is effected by employing an intermediate removable second sidewall spacer. Thus, the present invention enables complete decoupling of the length of the channel region in the N-channel transistor from the length of the channel region of the P-channel transistor.

Figure 2:
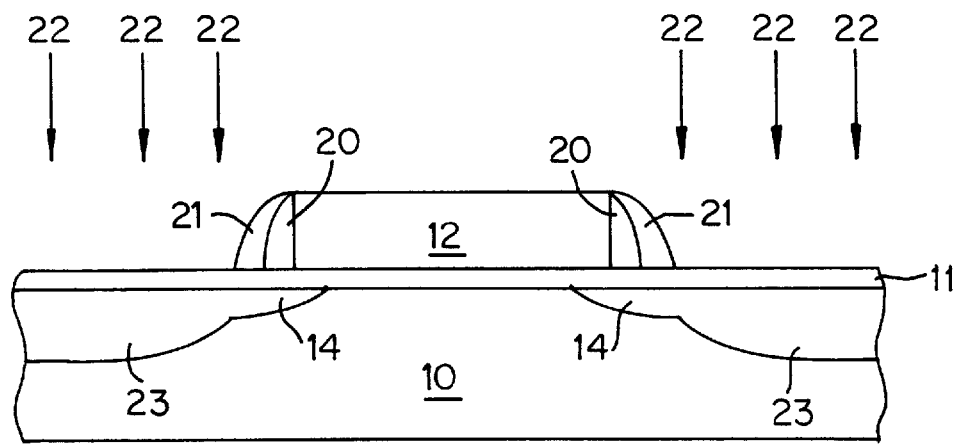
Figure 3:
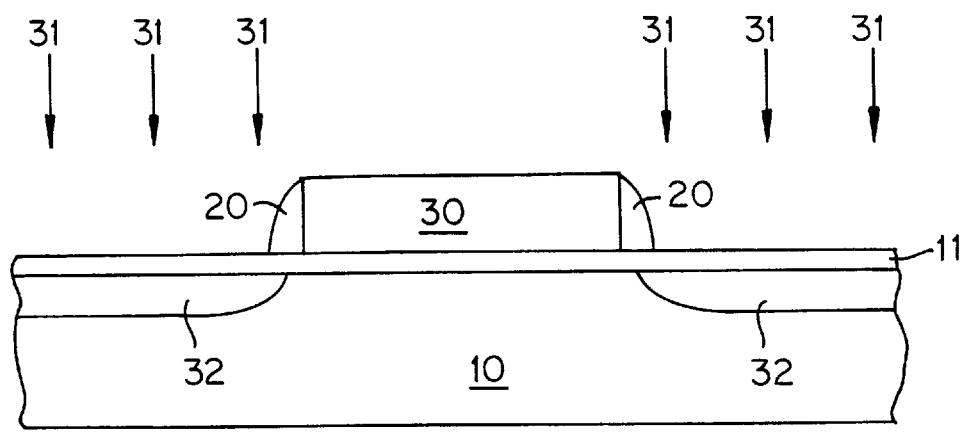

An embodiment of the present invention is schematically illustrated in FIGS. 1 through 4, wherein similar reference numerals denote similar features. Adverting to FIG. 1, gate dielectric layer 11 is formed on doped monocrystalline silicon semiconductor substrate 10, and doped polycrystalline silicon gate electrode 12 is formed thereon in the N-channel transistor region, while gate electrode layer 30 is formed in the P-channel transistor region (FIG. 3). N-type impurities are then ion implanted into the semiconductor substrate, as indicated by arrows 13, to form N-type lightly doped implants 14. First insulating sidewall spacers 20 are then formed on the side surfaces of gate electrode 12 and on the side surfaces of gate electrode 30 (FIG. 3). First insulating sidewall spacers 20 are formed of an insulating material such as a silicon oxide at a width selected for optimization of the length of the channel in the P-channel transistor region. Second sidewall spacers 21 are then formed on the first sidewall spacers 20 on gate electrode 12, as shown in FIG. 2, as well as on first sidewall spacers 20 on gate electrode 30 (not shown). The width of the second sidewall spacers is selected for optimization of the length of the lightly doped portion of the ultimately formed source/drain regions in the N-channel transistor.

The P-channel transistor region is masked and, employing the gate electrode 12 with first 20 and second 21 sidewall spacers thereon as a mask, N-type impurities are implanted into the semiconductor substrate, as indicated by arrows 22, to form moderately or heavily doped implants 23 in the semiconductor substrate. Activation annealing is then conducted to form the source/drain regions of the N-channel transistor.

The second insulating sidewall spacer, in accordance with this embodiment, is formed of an insulating material different from the first insulating material. For example, having formed the first sidewall spacers of a silicon oxide, the insulating material for the second sidewall spacer 21 is a silicon nitride. After activation of the source/drain regions of the N-channel transistor, the second sidewall spacers 21 are removed from the first sidewall spacer 20 of gate electrode 30, as by wet etching with nitric acid, leaving the first sidewall spacers 20 substantially intact on the side surfaces of gate electrode 30. The N-channel transistor region is masked and, employing gate electrode 30 and first sidewall spacers 20 thereon as a mask, P-channel impurities are ion implanted, as indicated by arrows 31, to form lightly doped implants 32 in the semiconductor substrate, as shown in FIG. 3.

Figure 4:
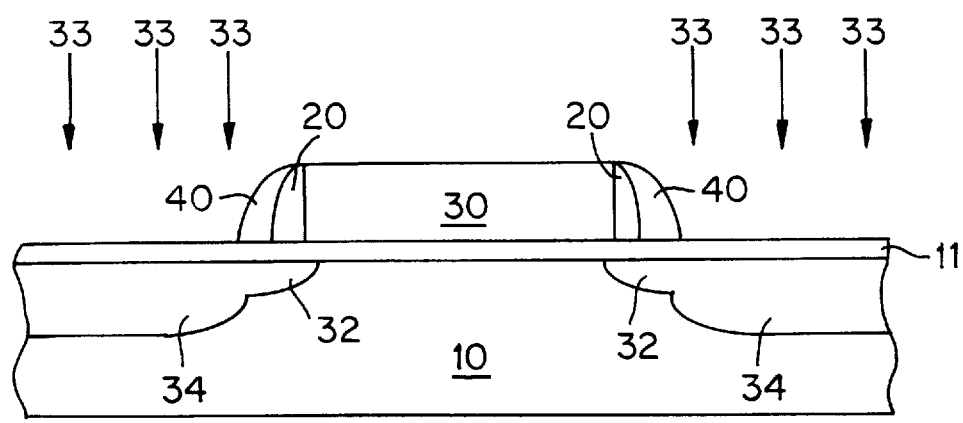

Adverting to FIG. 4, third sidewall spacers 40 are formed on the first sidewall spacers 31 on gate electrode 30. The combined width of first sidewall spacers 20 and third sidewall spacers 40 determines the length of the lightly doped portion of the ultimately formed source/drain regions of the P-channel transistor, independently. Since the width of third sidewall spacers 40 is determined independently of the width of the removable second sidewall spacers 21, the channel length of the N-channel transistors is optimized completely independently of the channel length of the P-channel transistor.

After formation of the third sidewall spacers, which can comprise an insulating material similar to the insulating material of first sidewall spacers 20, and masking the N-channel transistor masked, P-type impurities are ion implanted, as indicated by arrows 33, employing gate electrode 30 and first sidewall spacers 20 and third sidewall spacers 40 thereon as a mask, to form moderately or heavily doped implants 34 in the semiconductor substrate, as shown in FIG. 4. Activation annealing is then performed to form the source/drain regions of the P-channel transistor.

Thus, the present invention maintains the advantages of independently controlling the $X_J$ of the N-channel transistor and P-channel transistor as disclosed in copending application Ser. No. 08/924,680. In addition, in accordance with the present invention, the channel length of the N-channel transistor and the channel length of the P-channel transistor are completely decoupled by employing intermediate second sidewall spacers 21 (FIG. 2) and third sidewall spacers 40 (FIG. 4), wherein the width of second sidewall spacers 21 and width of third sidewall spacers 40 are selected independently. The implantation and activation annealing conditions are selected for independent optimization of N-channel transistor and P-channel transistor performance.

The present invention is applicable to the production of various types of semiconductor devices, particularly high density semiconductor devices with submicron features of about 0.25 microns and below, exhibiting high speed characteristics and improved reliability. The present invention is cost effective and can easily be integrated into conventional processing.

In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail, in order not to unnecessarily obscure the present invention.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a CMOS semiconductor device comprising an N-channel transistor and a P-channel transistor, which method comprises:

forming a dielectric layer on a surface of a semiconductor substrate;

forming a conductive layer on the dielectric layer;

patterning the conductive layer to form a first gate electrode for the N-channel transistor and a second gate electrode for the P-channel transistor, each gate electrode having an upper surface and side surfaces;

using the first gate electrode as a mask, implanting impurities to form N-type lightly doped implants in the semiconductor substrate;

forming first sidewall spacers, comprising a first insulating material and having a first width, on the side surfaces of the first and second gate electrodes;

forming second sidewall spacers, comprising a second insulating material and having a second width, on the first sidewall spacers on the first and second gate electrodes;

using the first gate electrode and first and second sidewall spacers thereon as a mask, implanting impurities to form N-type moderately or heavily doped implants in the semiconductor substrate;

activation annealing at a first temperature to form source/drain regions of the N-channel transistor comprising N-type lightly doped and moderately or heavily doped portions, the N-type lightly doped portions extending below the surface of the semiconductor substrate to a first depth and the N-type moderately or heavily doped portions extending to a second depth greater than the first depth;

removing the second sidewall spacers from the second gate electrode leaving the first sidewall spacers thereon;

using the second gate electrode and first sidewall spacers thereon as a mask, implanting impurities to form P-type lightly doped implants in the semiconductor substrate;

forming third sidewall spacers, comprising a third insulating material and having a third width, on the first sidewall spacers on the second gate electrode;

using the second gate electrode and first and third sidewall spacers thereon as a mask, implanting impurities to form P-type moderately or heavily doped implants in the semiconductor substrate; and activation annealing at a second temperature to form source/drain regions of the P-channel transistor comprising P-type lightly doped and moderately or heavily doped portions, the P-type lightly doped portions extending below the surface of the semiconductor substrate to a third depth and P-type moderately or heavily doped portions extending to a fourth depth greater than the third depth.

2. The method according to claim 1, wherein the first insulating material is different from the second insulating material.

3. The method according to claim 2, wherein the first insulating material comprises an oxide, and the second insulating material comprises a nitride.

4. The method according to claim 3, wherein the first insulating material comprises silicon oxide, and the second insulating material comprises silicon nitride.

5. The method according to claim 4, comprising etching to remove the second sidewall spacers leaving the first sidewall spacers substantially intact.

6. The method according to claim 5, comprising wet etching with nitric acid to remove the second sidewall spacers.

7. The method according to claim 2, wherein the first and third insulating materials are the same.

8. The method according to claim 1, wherein the semiconductor substrate comprises monocrystalline silicon and a dielectric layer comprises silicon oxide.

9. The method according to claim 8, wherein the conductive layer comprises doped polycrystalline silicon.

10. The method according to claim 1, comprising ion implanting impurities at a dosage of about $5 \times 10^{13}$ atoms $cm^{-2}$ to about $5 \times 10^{14}$ atoms $cm^{-2}$ and at an energy of about 10 KeV to about 30 KeV to form the N-type lightly doped implants.

11. The method according to claim 10, comprising ion implanting impurities at a dosage of about $5 \times 10^{14}$ atoms $cm^{-2}$ to about $5 \times 10^{15}$ atoms $cm^{-2}$ and at an energy of about 40 KeV to about 60 KeV to form the N-type moderately or heavily doped implants.

12. The method according to claim 1, comprising ion implanting impurities at a dosage of about $5 \times 10^{13}$ atoms $cm^{-2}$ to about $5 \times 10^{14}$ atoms $cm^{-2}$ and at an energy of about 5 KeV to about 10 KeV to form the P-type lightly doped implants.

13. The method according to claim 12, comprising ion implanting impurities at a dosage of about $5 \times 10^{14}$ atoms $cm^{-2}$ to about $5 \times 10^{15}$ atoms $cm^{-2}$ and at an energy of about 20 KeV to about 40 KeV to form the P-type moderately or heavily doped implants.

14. The method according to claim 1, wherein the sidewall spacers are formed by depositing a layer of insulating material and etching.

15. The method according to claim 1, wherein the second temperature is less than the first temperature.

16. The method according to claim 15, wherein the first temperature is about 1,000° C. to about 1,1000°C., and the second temperature is about 9000°C. to about 1,000°C.

17. The method according to claim 1, wherein the first depth is about 600 Å to about 800 Å and the third depth is about 600 Å to about 800 Å.

18. The method according to claim 1, wherein the first, second and third widths are different.

19. The method according to claim 18, wherein the first width is about 300 Å to about 500 Å, the second width is about 300 Å to about 800 Å, and the third width is about 500 Å to about 1,500 Å.

* * * * *

UNITED STATES PATENT AND TRADEMARK OFFICE
CERTIFICATE OF CORRECTION

PATENT NO. : 5,846,857
DATED : December 8, 1998
INVENTOR(S) : Dong-Hyuk JU

It is certified that error appears in the above-indentified patent and that said Letters Patent is hereby corrected as shown below:

```
In the Claims,
Column 10, Line 18, change "1,1000" to --1,100--
Column 10, Line 19, change "9000" to --900--.
```

Signed and Sealed this

Sixteenth Day of March, 1999

Attest:

Q. TODD DICKINSON

Attesting Officer    Acting Commissioner of Patents and Trademarks